United States Patent
Kato et al.

(10) Patent No.: US 7,985,714 B2
(45) Date of Patent: Jul. 26, 2011

(54) $NB_3SN$ SUPERCONDUCTING WIRE AND PRECURSOR THEREFOR

(75) Inventors: Hiroyuki Kato, Kobe (JP); Takashi Hase, Kobe (JP); Kyoji Zaitsu, Kobe (JP)

(73) Assignee: Kobe Steel, Ltd., Hyogo (JP)

( * ) Notice: Subject to any disclaimer, the term of this patent is extended or adjusted under 35 U.S.C. 154(b) by 964 days.

(21) Appl. No.: 11/902,471

(22) Filed: Sep. 21, 2007

(65) Prior Publication Data

US 2008/0167192 A1   Jul. 10, 2008

(30) Foreign Application Priority Data

Sep. 25, 2006 (JP) ................. 2006-259720

(51) Int. Cl.
*H01B 12/00* (2006.01)
*H01L 39/24* (2006.01)

(52) U.S. Cl. ........ 505/510; 505/230; 505/231; 505/887; 428/930; 428/662; 174/125.1; 29/599; 148/98; 420/901

(58) Field of Classification Search ............. 505/231, 505/232, 234, 230, 510, 887; 174/125.1; 428/930, 662; 148/96, 98; 29/599; 420/901
See application file for complete search history.

(56) References Cited

FOREIGN PATENT DOCUMENTS

| JP | 49-114389 | | 2/1973 |
|---|---|---|---|
| JP | 2-213008 | | 2/1989 |
| JP | 02-213008 | * | 8/1990 |
| JP | 02-299107 | * | 12/1990 |

OTHER PUBLICATIONS

Egawa, K., Kubo, Y., Nagai, T., Sone, T., and Ikeda, B. "*Development of Internal-tin Processed $Nb_3Sn$ Superconducting Wires*", J. Cryo. Soc. Jpn., vol. 39(9), 2004, pp. 391-397.

Yoshizaki, K., Taguchi, O., Fujiwara, F., Imaizumi, M., Wakata, M., Hashimoto, Y., Wakamoto, K., Yamada, T., and Satow, T. "*$Nb_3Sn$ Superconducting Cables Processed by Internal Tin Diffusion*", IEEE Transactions on Magnetics, vol. MAG-19(3), 1983, pp. 1131-1134.

Rodrigues, C.A. et al., "Development, Heat Treatment Optimization and Microstructural Characterization of $Nb_3Sn$ Superconductor Wire", IEEE Transactions on Applied Superconductivity, vol. 13, No. 2, Jun. 2003, pp. 3426-3429.

Yasohama, K. et al., "Hysteresis loss and critical current density of multifilamentary $(NbW)_3Sn$ composite conductor for AC use", Physica C, vol. 354, 2001, pp. 252-255.

Extended European Search Report for 07018314.0-222, dated Feb. 12, 2008.

* cited by examiner

*Primary Examiner* — Stanley Silverman
*Assistant Examiner* — Kallambella Vijayakumar
(74) *Attorney, Agent, or Firm* — Stites & Harbison PLLC; Juan Carlos A. Marquez, Esq.

(57) ABSTRACT

A precursor for fabricating a $Nb_3Sn$ superconducting wire by an internal Sn process includes one or a plurality of stabilizing copper portions collectively disposed in the center, each stabilizing copper portion being provided with a diffusion barrier layer in the periphery thereof, and a superconducting matrix portion disposed so as to surround the one or the plurality of stabilizing copper portions, the superconducting matrix portion including a Nb or Nb-based alloy core and a Sn or Sn-based alloy core embedded in a Cu or Cu-based alloy matrix.

3 Claims, 7 Drawing Sheets

NB₃SN SUPERCONDUCTING WIRE AND PRECURSOR THEREFOR

BACKGROUND OF THE INVENTION

1. Field of the Invention

The present invention relates to a precursor for fabricating a $Nb_3Sn$ superconducting wire by an internal Sn process (hereinafter, which may be referred to as a "precursor for fabricating a superconducting wire") and a $Nb_3Sn$ superconducting wire fabricated using such a precursor. More particularly, the invention relates to a $Nb_3Sn$ superconducting wire useful as a material for superconducting magnets and a precursor for the $Nb_3Sn$ superconducting wire.

2. Description of the Related Art

Examples of the practical use of superconducting wires include superconducting magnets that are used for high-resolution nuclear magnetic resonance (NMR) analyzers, nuclear fusion devices, accelerators, etc. As the superconducting wires used for superconducting magnets, $Nb_3Sn$ wires have been put into practical use. In the fabrication of $Nb_3Sn$ superconducting wires, a bronze process is primarily employed. In the bronze process, a plurality of cores made of Nb or a Nb-based alloy are embedded in a Cu—Sn-based alloy (bronze) matrix to form a composite wire. The composite wire is subjected to diameter reduction, such as extrusion or wire drawing, so that the cores have a smaller diameter and formed into filaments (hereinafter referred to as Nb-based filaments). A plurality of composite wires, each being composed of the Nb-based filaments and bronze, are bundled into a wire group. Copper for stabilization (stabilizing copper) is arranged in the periphery of the wire group, and then area reduction is further performed. Subsequently, the wire group, which has been subjected to diameter reduction, is subjected to heat treatment (diffusion heat treatment) at about 600° C. to 800° C. to generate $Nb_3Sn$ compound layers at the interfaces between the bronze matrix and the Nb-based filaments.

However, in this process, since the concentration of Sn solid soluble in bronze is limited (15.8% by mass or less), the resulting $Nb_3Sn$ compound layers have a small thickness, and the crystallinity is degraded. Thus, it is not possible to obtain a high critical current density Jc, which is disadvantageous. In a superconducting magnet (hereinafter, which may be represented by a "NMR magnet"), as the critical current density Jc of the wire is increased, the NMR magnet can be made more compact, and it is possible to reduce the cost and shorten the delivery time of the magnet. Furthermore, since the area of the superconducting portion in the conductor can be reduced, it is possible to reduce the cost of the wire itself.

In addition to the bronze process described above, an internal Sn process is also known as the process for fabricating a $Nb_3Sn$ superconducting wire. In the internal Sn process (which is also referred to as an "internal diffusion process"), unlike the bronze process, since the Sn concentration is not limited due to the solid solubility limit, the Sn concentration can be set as high as possible, and a high-quality $Nb_3Sn$ phase can be generated. Therefore, it is believed to be possible to obtain a high critical current density Jc. Furthermore, in the wire fabricated by the bronze process, since work hardening occurs in the Cu—Sn alloy during cold working, many annealing steps are required. In contrast, in the internal Sn process, annealing is seldom required and it is possible to shorten the delivery time. Therefore, use of superconducting wires fabricated by the internal Sn process (hereinafter, which may be referred to as "$Nb_3Sn$ superconducting wires by the internal Sn process") in the NMR magnet application has been desired.

Figure 1:
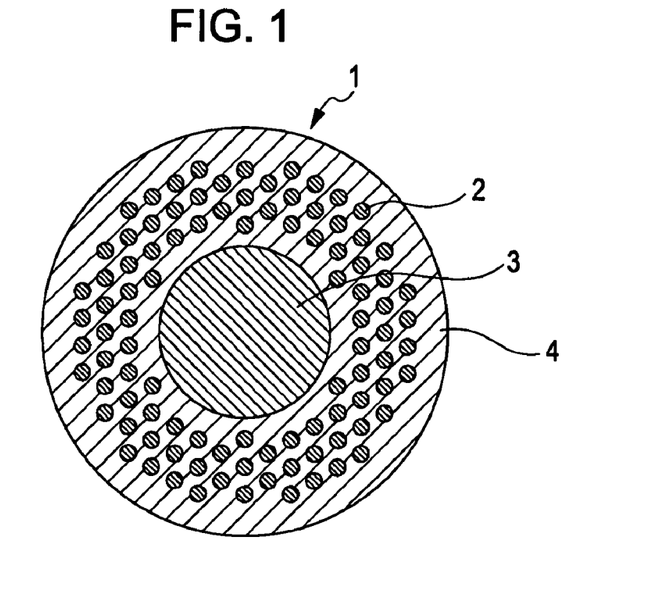
FIG. 1 is a cross-sectional view schematically showing an example of a structure of a precursor for fabricating a superconducting wire used in an internal Sn process (single element wire)

In the internal Sn process, as shown in FIG. 1 (which is a schematic diagram of a precursor for fabricating a $Nb_3Sn$ superconducting wire), a core 3 made of Sn or a Sn-based alloy (hereinafter, which may be referred to as a "Sn-based metal core") is embedded in the center of a Cu or Cu-based alloy member (hereinafter, which may be referred to as a "Cu matrix") 4, and a plurality of cores 2 made of Nb or a Nb-based alloy (hereinafter, which may be referred to as "Nb-based metal cores") are arranged so as not to be in contact with each other in the Cu matrix 4 which surrounds the Sn-based metal core 3 to form a precursor (precursor for fabricating a superconducting wire) 1. The precursor 1 is subjected to wire drawing, and then subjected to heat treatment (diffusion heat treatment) so that Sn in the Sn-based metal core 3 is diffused and reacted with the Nb-based metal cores 2 to generate a $Nb_3Sn$ phase in the wire. For example, refer to claims, etc. in Japanese Unexamined Patent Application Publication No. 49-114389 (Patent Document 1).

In the precursor described above, as shown in FIG. 2, it is common to employ a structure (precursor 5) in which a diffusion barrier layer 6 is disposed between a portion in which the Nb-based metal cores 2 and the Sn-based metal core 3 are arranged and an external stabilizing copper layer 4a. The diffusion barrier layer 6 is, for example, composed of a Nb layer, a Ta layer, or two layers including a Nb layer and a Ta layer. The diffusion barrier layer 6 prevents Sn in the Sn-based metal core 3 from being diffused to outside during the diffusion heat treatment and has an effect of increasing the purity of Sn in the superconducting wire.

The precursor for fabricating the superconducting wire described above is produced by the method described below. First, a Nb-based metal core inserted into a Cu matrix tube is subjected to diameter reduction, such as extrusion or wire drawing, to form a composite member (usually having a hexagonal cross section), and the composite member is cut into an appropriate length. A plurality of the resulting composite members are inserted into a billet having an external cylinder made of Cu and provided with or without a diffusion barrier layer, and a Cu matrix (solid Cu billet) is arranged in the center thereof. After extrusion is performed, the Cu matrix in the center is mechanically perforated to form a pipe-shaped composite member. Alternatively, in another method, a plurality of the composite members are inserted into a hollow billet, which includes a Cu external cylinder and a Cu internal cylinder and which is provided with or without a diffusion barrier layer 6, (between the external cylinder and the internal cylinder), and pipe extrusion is performed to form a pipe-shaped composite member.

Figure 2:
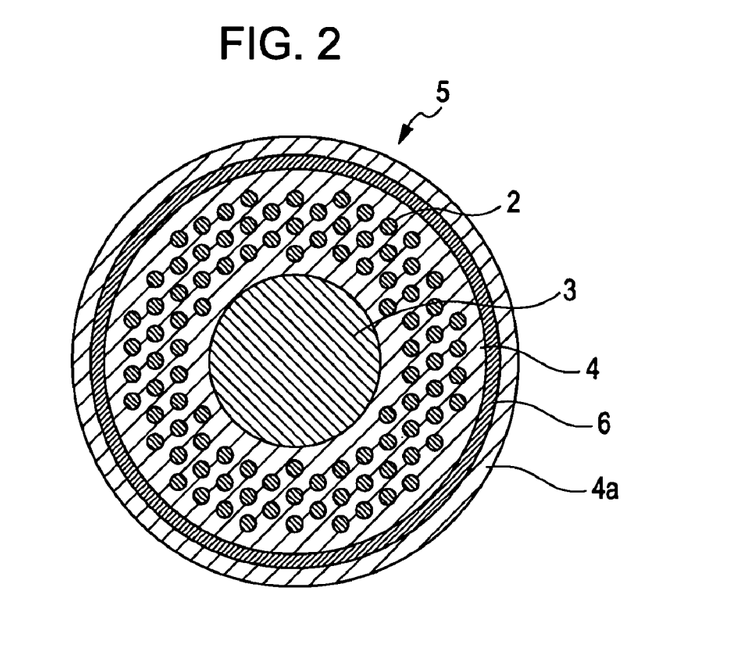
FIG. 2 is a cross-sectional view schematically showing another example of a structure of a precursor for fabricating a superconducting wire used in an internal Sn process (single element wire)

Subsequently, a Sn-based metal core is inserted into the void in the center of the pipe-shaped composite member fabricated by any of the methods described above, and diameter reduction is performed. Thereby, a precursor element including the Nb-based metal cores 2 and the Sn-based metal core 3 as shown in FIG. 1 or 2 is obtained. Hereinafter, such a precursor element may be referred to as a "single element wire". In FIG. 1 or 2, a single element wire having a structure in which one Sn-based metal core 3 is arranged is shown. However, the structure of the single element wire is not limited thereto, and it is also possible to employ a structure in which a plurality of Sn-based metal cores 3 are arranged.

A plurality of the precursors (single element wires) fabricated as described above are bundled into an aggregate and inserted into a Cu matrix tube provided with or without a diffusion barrier layer 6, and diameter reduction is further performed to form a precursor for fabricating a multi-core superconducting wire (hereinafter, which may be referred to as a "multi-element wire")

Figure 3:
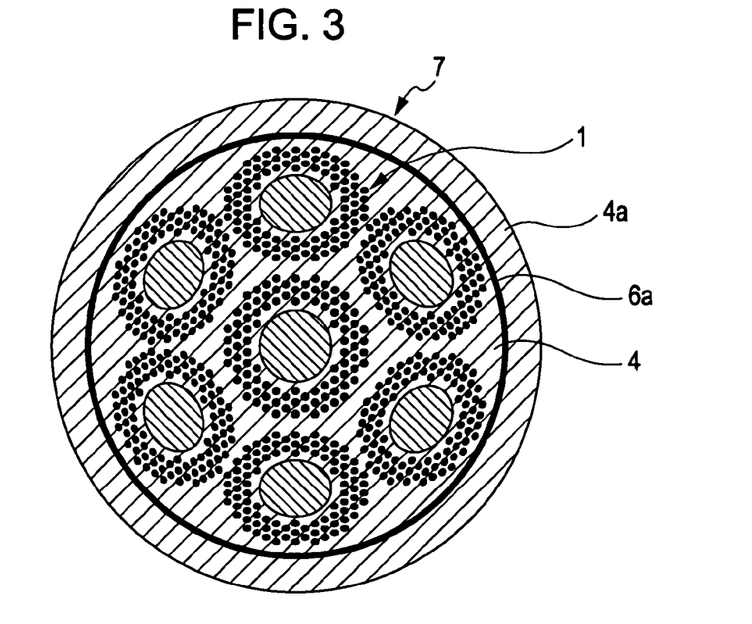
FIG. 3 is a cross-sectional view schematically showing an example of a structure of a precursor for fabricating a superconducting wire used in an internal Sn process (multi-element wire)
Figure 4:
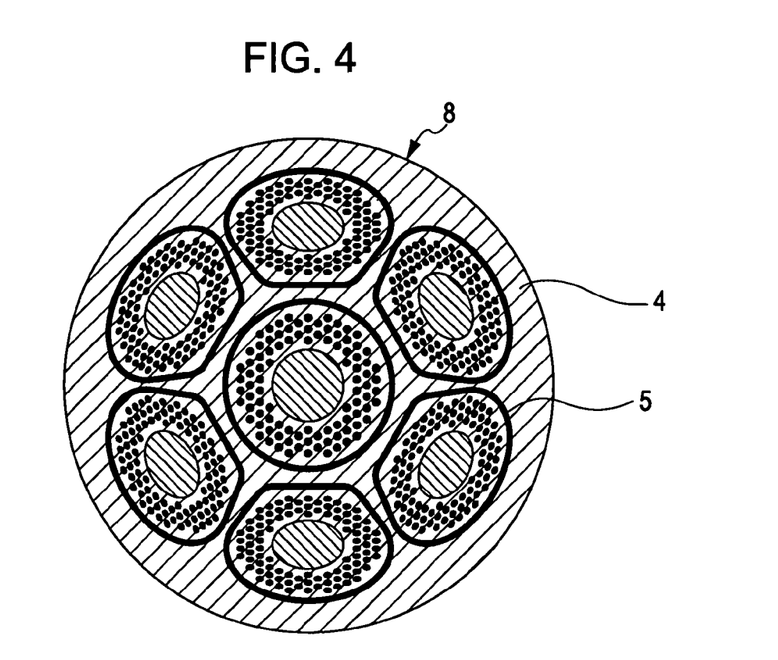
FIG. 4 is a cross-sectional view schematically showing another example of a structure of a precursor for fabricating a superconducting wire used in an internal Sn process (multi-element wire)

FIGS. 3 and 4 show examples of the structure of a multi-element wire. FIG. 3 shows a multi-element wire 7, in which a plurality of precursors (single element wires) 1, each shown in FIG. 1, are bundled as an aggregate and embedded in a Cu matrix 4 provided with a diffusion barrier layer 6a and a stabilizing copper portion 4a, to constitute a superconducting matrix portion. For example, refer to Teion Kogaku (Cryogenic Engineering) Vol. 39(9), 2004, pp. 391-397 (Non-Patent Document 1). FIG. 4 shows a multi-element precursor 8, in which a plurality of precursors (single element wires) 5, each shown in FIG. 2, are bundled as an aggregate and embedded in a Cu matrix 4 not provided with a diffusion barrier layer, to constitute a superconducting matrix portion. For example, refer to IEEE Transaction on Magnetics, Vol. MAG-19, No. 3, May 1983, pp. 1131-1134 (Non-Patent Document 2).

SUMMARY OF THE INVENTION

In a superconducting magnet used for an NMR analyzer or the like, a remarkably stable rate of the change in the magnetic field with time (decrement) of 0.01 ppm/hr or less is required. Consequently, the operation must be conducted in a "permanent current mode" in which the supercurrent keeps flowing permanently in a loop. In an actual magnet, a plurality of superconducting coils are connected for use. In order to realize the permanent current mode, it is also necessary to maintain the superconducting state at joints between the coils. Consequently, the connection must be performed with the $Nb_3Sn$ superconducting filaments being exposed without intervention of a diffusion barrier layer composed of a Nb-based metal or a Ta-based metal that exhibits normal conduction in an applied magnetic field (about 0.5 T) at positions where the joints are placed.

With respect to $Nb_3Sn$ superconducting wires fabricated by the bronze process, in addition to an "externally stabilized wire" in which a stabilizing copper portion and a diffusion barrier layer are disposed outside a superconducting matrix portion as described above, an "internally stabilized wire" in which a stabilizing copper portion and a diffusion barrier layer are disposed inside a superconducting matrix portion is known. From the standpoint that superconducting properties are maintained well, the "externally stabilized wire" is generally employed. In such a wire, it is possible to expose superconducting filaments, and the method for connecting the exposed superconducting filaments has been established.

On the other hand, in $Nb_3Sn$ superconducting wires fabricated by the internal Sn process, it is difficult to obtain rectangular wires, and round wires are generally used. In the case of a rectangular wire having the same internal structure as that shown in FIG. 3, it is possible to scrape off the diffusion barrier layer. However, in the case of a round wire, it is difficult to scrape evenly, and it is not possible to scrape off the diffusion barrier layer. Furthermore, in the same internal structure as that shown in FIG. 4, even in the case of a rectangular wire, it is impossible to scrape off the diffusion barrier layers. For the reasons described above, it is not possible to remove diffusion barrier layers in $Nb_3Sn$ superconducting wires having a structure with the cross section as that shown in FIG. 3 or 4. As a result, after the stabilizing copper portion is removed, when connection is made, the diffusion barrier layer is exposed and resistance occurs at the joint. This has made it difficult to use superconducting wires by the internal Sn process in the NMR magnet application.

The present invention has been achieved under these circumstances. The objects of the present invention are to provide a $Nb_3Sn$ superconducting wire by an internal Sn process, in which electrical resistance can be minimized when superconducting wires are connected to each other, and a high critical current density Jc property can be expected, which allows application in NMR magnets, and to provide a precursor therefor (precursor for fabricating the superconducting wire).

A precursor for fabricating a superconducting wire according to the present invention, which can achieve the objects described above, is a precursor for fabricating a $Nb_3Sn$ superconducting wire by an internal Sn process, which includes one or a plurality of stabilizing copper portions collectively disposed in the center, each stabilizing copper portion being provided with a diffusion barrier layer in the periphery thereof, and a superconducting matrix portion disposed so as to surround the one or the plurality of stabilizing copper portions, the superconducting matrix portion including a Nb or Nb-based alloy core and a Sn or Sn-based alloy core embedded in a Cu or Cu-based alloy matrix.

In an example of the structure of the precursor for fabricating the superconducting wire of the present invention, the superconducting matrix portion includes an aggregate of precursor elements each including a plurality of Nb or Nb-based alloy cores and at least one Sn or Sn-based alloy core, the aggregate being embedded in a Cu or Cu-based alloy matrix. In a preferred embodiment, apart from the diffusion barrier layer, a diffusion barrier layer made of Nb or an Nb-based alloy is provided for each precursor element.

When a structure in which a diffusion barrier layer is provided for each precursor element is employed, preferably, the diffusion barrier layer provided for each precursor element has a thickness that is equal to or smaller than the diameter of the Nb or Nb-based alloy core, or preferably, a Sn or Sn-based alloy core is disposed in the periphery of the diffusion barrier layer provided for each precursor element.

By subjecting the above-described precursor for fabricating the superconducting wire to diffusion heat treatment, it is possible to fabricate a $Nb_3Sn$ superconducting wire that exhibits desired superconducting properties (critical current density Jc and magnetic field decrement).

In the precursor for fabricating the superconducting wire according to the present invention, one or a plurality of stabilizing copper portions are collectively disposed in the center, each stabilizing copper portion being provided with a diffusion barrier layer in the periphery thereof, and a superconducting matrix portion is disposed so as to surround the one or the plurality of stabilizing copper portions, the superconducting matrix portion including a Nb or Nb-based alloy core and a Sn or Sn-based alloy core embedded in a Cu or Cu-based alloy matrix. Consequently, $Nb_3Sn$ superconducting filaments can be easily exposed by removing the outer copper layer after diffusion heat treatment is performed, and connection can be made in a state where the superconducting wire connection resistance is minimized.

DESCRIPTION OF THE PREFERRED EMBODIMENTS

The present inventors have studied from various aspects in order to achieve the objects described above. As a result, it has been found that when an "internally stabilized" structure in which one or a plurality of stabilizing copper portions are disposed in the center, each stabilizing copper portion being provided with a diffusion barrier layer in the periphery thereof, is basically employed and when a superconducting matrix portion is disposed so as to surround the one or the plurality of stabilizing copper portions, the superconducting matrix portion including a Nb or Nb-based alloy core and a Sn or Sn-based alloy core embedded in a Cu or Cu-based alloy matrix, $Nb_3Sn$ superconducting filaments can be easily exposed by removing the copper layer (Cu or Cu-based alloy matrix) constituting the superconducting matrix portion after diffusion heat treatment is performed, and connection can be made while maintaining the superconducting state. Thereby, the present invention has been completed. The structures of precursors for fabricating a superconducting wire according to the present invention (hereinafter, which may be simply referred to as "precursors") will be described below with reference to the drawings.

Figure 5A:
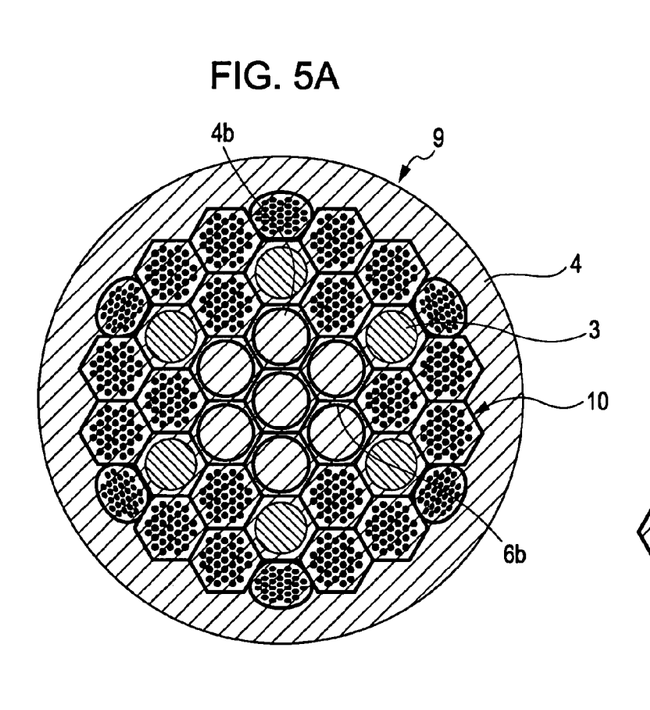
FIGS. 5A and 5B are cross-sectional views schematically showing an example of a structure of a precursor for fabricating a superconducting wire (multi-element wire) according to the present invention.

FIGS. 5A and 5B are cross-sectional views showing an example of a basic structure of a precursor of the present invention. In this structure, a plurality of rod-like stabilizing copper portions 4b (seven stabilizing copper portions in this example) are collectively disposed in the center, each stabilizing copper portion being provided with a diffusion barrier layer 6b in the periphery thereof, and a superconducting matrix portion is disposed so as to surround the stabilizing copper portions 4b, the superconducting matrix portion including a plurality of Nb-based metal cores 2 and Sn-based metal cores 3 embedded in a Cu matrix 4 (refer to FIG. 5A). The diffusion barrier layer 6b provided in the periphery of the stabilizing copper portion 4b may be composed of a Nb layer, a Ta layer, or two layers including a Nb layer and a Ta layer. As in the conventional diffusion barrier layer 6a shown in FIG. 3, the diffusion barrier layer 6b functions as a barrier for preventing Sn from being diffused into the stabilizing copper portion 4b. In order to obtain a stabilizing copper wire provided with a barrier, a sheet member (e.g., a Nb sheet) is wrapped around a rod-like stabilizing copper portion 4b, and the stabilizing copper portion 4b is inserted into a Cu pipe or a Cu billet, followed by extrusion or wire drawing.

Figure 5B:
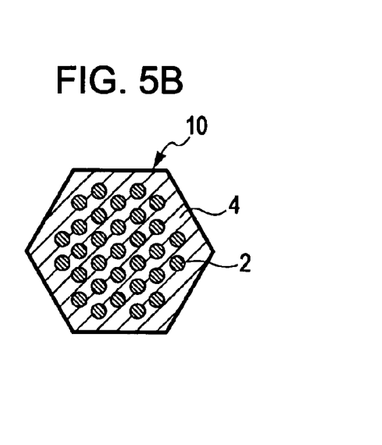

A Nb-based metal core 2 is inserted into a Cu pipe, followed by extrusion or wire drawing. A plurality of the resulting wires are inserted into a Cu pipe or billet, followed by extrusion or wire drawing. Thereby, a Cu/Nb composite multi-core wire 10 having a hexagonal cross section as shown in FIG. 5B is obtained. The reference numeral 4 represents a Cu matrix composed of the Cu pipe. Furthermore, a Sn-based metal core 3 is inserted into a Cu pipe, followed by wire drawing, to obtain a Cu/Sn composite wire. A plurality of stabilizing copper wires 4b provided with the barrier layer are bundled and arranged in the center, and a plurality of Cu/Nb composite multi-core wires and Cu/Sn composite wires are bundled and disposed so as to surround the plurality of stabilizing copper wires 4b. The resulting workpiece is inserted into a Cu pipe, followed by wire drawing. Thereby, an internally stabilized precursor 9 as shown in FIG. 5A is obtained.

In another embodiment of the present invention, a plurality of single element wires 1, each being the same as that shown in FIG. 1, are disposed in a superconducting matrix portion (Cu matrix 4) in the periphery of the stabilizing copper portion 4b provided with the barrier layer 6b. The resulting workpiece is inserted into a Cu pipe, followed by wire drawing. Thereby, an internally stabilized precursor 11 as shown in FIG. 6 is obtained.

In Nb₃Sn superconducting wires obtained by subjecting the conventional multi-element wires shown in FIGS. 3 and 4 to diffusion heat treatment, when superconducting wires are connected to each other after the stabilizing copper portion is removed subsequent to heat treatment, in the case where the diffusion barrier layer 6 or 6a is composed of Ta, in a magnetic field to which the joint is exposed, "Ta itself" or "the entire Ta—Sn compound formed after reaction between Ta and Sn" exhibits normal conduction, and which causes resistance. Even in the case where the diffusion barrier layer 6 or 6a is composed of Nb, in order to prevent Sn from being diffused into the stabilizing copper portion 4a, the diffusion barrier layer 6 or 6a cannot be allowed to react completely, and an unreacted Nb layer partially remains, resulting in normal conduction, which causes resistance. In the conventional multi-element wires shown in FIGS. 3 and 4, since the Nb₃Sn superconducting filaments are present inside the diffusion barrier layer 6 or 6a, the Nb₃Sn superconducting filaments are not exposed.

Figure 6:
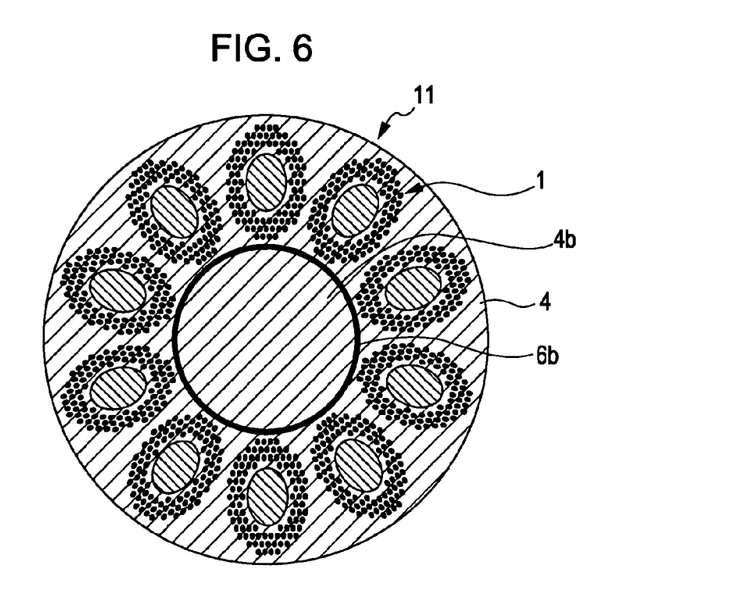
FIG. 6 is a cross-sectional view schematically showing an example of a structure of a precursor for fabricating a superconducting wire (multi-element wire) according to the present invention, which is produced by combining the single element wire shown in FIG. 1 and a stabilizing copper portion provided with a diffusion barrier layer.

In contrast, in the precursors 9 and 11 shown in FIGS. 5A and 5B and FIG. 6, it is possible to expose the Nb₃Sn superconducting filaments only by removing the external Cu layer (Cu matrix 4) subsequent to diffusion heat treatment. Thus, superconducting wires can be connected to each other without the occurrence of resistance.

Figure 7:
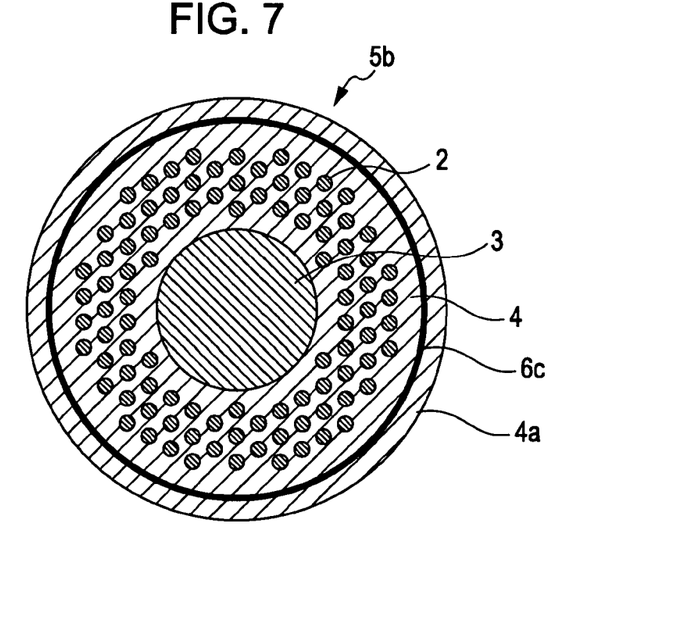
FIG. 7 is a cross-sectional view schematically showing an example of a structure of a precursor for fabricating a superconducting wire (single element wire), in which a thin diffusion barrier layer is disposed.
Figure 8:
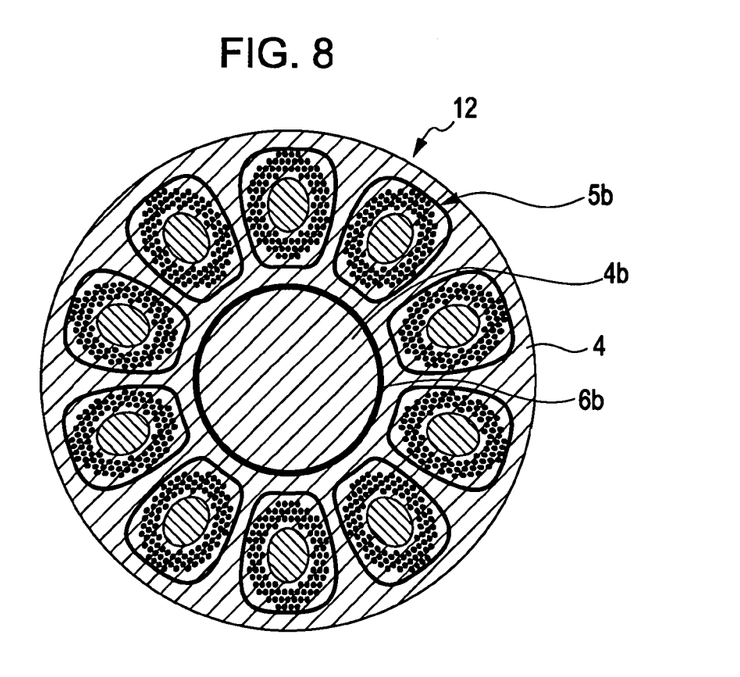
FIG. 8 is a cross-sectional view schematically showing an example of a structure of a precursor for fabricating a superconducting wire (multi-element wire) according to the present invention, which is produced by combining the precursor for fabricating a superconducting wire (single element wire) shown in FIG. 7 and a stabilizing copper portion provided with a diffusion barrier layer.

In another embodiment of the present invention, in order to improve the critical current density (Jc) property by preventing Sn from being diffused to outside of the single element wire, a structure may be employed, in which a precursor (single element wire) 5b including a diffusion barrier layer 6c composed of a Nb layer having a thickness that is equal to or smaller than the diameter of the Nb-based metal core 2 as shown in FIG. 7 is formed in the same manner as that described with reference to FIG. 2 (the same reference numerals being used for the corresponding parts other than the above), and a plurality of such precursors are disposed so as to surround a stabilizing copper portion 4b provided with a diffusion barrier layer 6b to form a precursor 12 (multi-element wire) as shown in FIG. 8.

Figure 9:
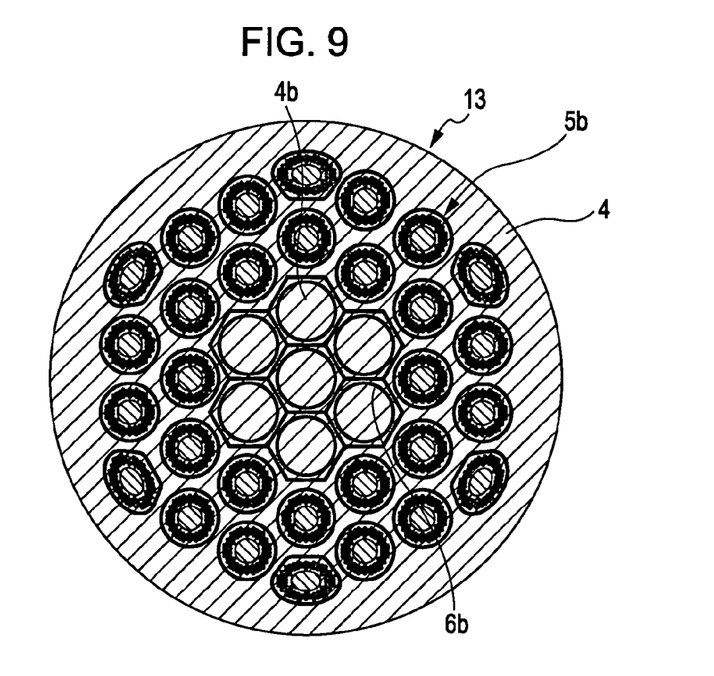
FIG. 9 is a cross-sectional view schematically showing an example of a structure of a precursor for fabricating a superconducting wire (multi-element wire) according to the present invention, which is produced by combining the precursor for fabricating a superconducting wire (single element wire) shown in FIG. 7 and a stabilizing copper portion provided with a diffusion barrier layer.

In another embodiment of the present invention, a structure may be employed, in which a plurality of stabilizing copper portions 4b each provided with a diffusion barrier layer 6b are bundled and arranged in the center, and in order to improve the critical current density (Jc) property as in the previous embodiment, a plurality of precursors 5b (single element wires) each shown in FIG. 7 are disposed in the periphery thereof (refer to FIG. 9).

Figure 10:
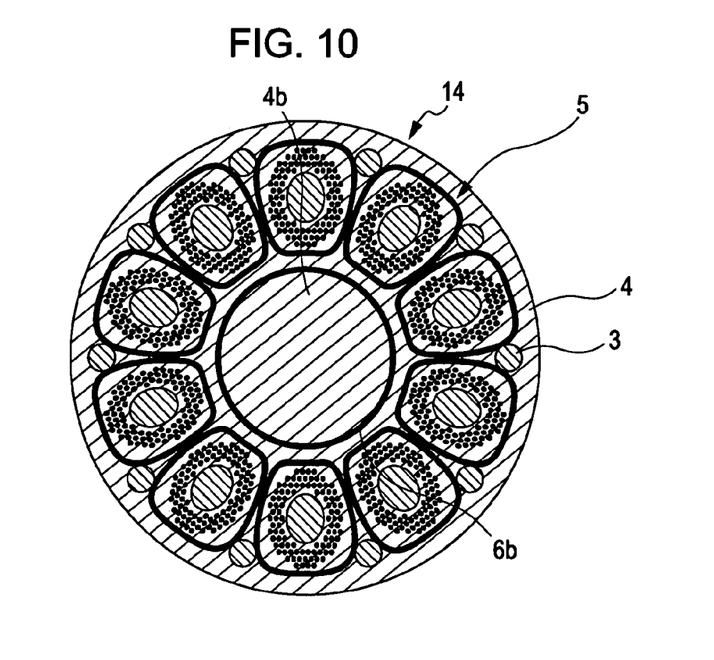
FIG. 10 is a cross-sectional view schematically showing an example of a structure of a precursor for fabricating a superconducting wire (multi-element wire) according to the present invention, which is produced by combining the precursor for fabricating a superconducting wire (single element wire) shown in FIG. 2, Sn-based metal cores arranged in a Cu matrix, and a stabilizing copper wire provided with a diffusion barrier layer.

As another measure for improving the critical current density (Jc) property in the present invention, a structure of a precursor 14 (multi-element wire) as shown in FIG. 10 may also be employed, in which precursors 5 (single element wires) each as shown in FIG. 2 and Sn-based metal cores 3 are arranged in a Cu matrix 4.

Figure 11:
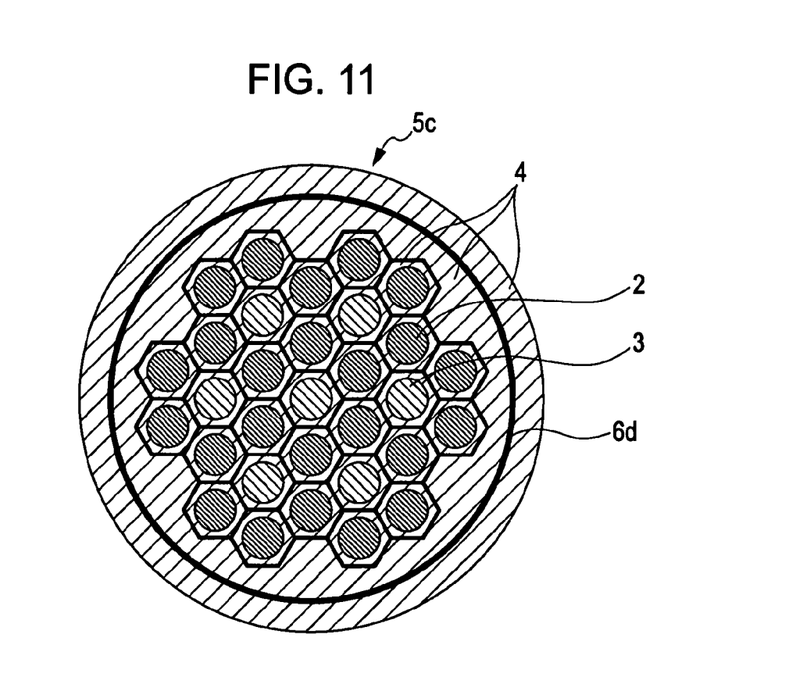
FIG. 11 is a cross-sectional view schematically showing an example of a structure of a precursor for fabricating a superconducting wire (single element wire), which is produced by combining Nb/Cu composite wires and Sn/Cu composite wires.

In another embodiment of the present invention, a Nb-based metal core 3 is inserted into a Cu pipe or billet, followed by extrusion or wire drawing, to obtain a Cu/Nb single-core composite wire. Furthermore, a Sn-based metal core 3 is inserted into a Cu pipe, followed by wire drawing, to obtain a Cu/Sn single-core composite wire. A plurality of such Cu/Nb single-core composite wires and a plurality of such Cu/Sn single-core composite wires are bundled, and a diffusion barrier layer 6d composed of Nb is wrapped therearound. The resulting workpiece is inserted into a Cu pipe, followed by wire drawing, to obtain a precursor 5c (single element wire) as shown in FIG. 11. A plurality of stabilizing copper portions 4b each provided with a diffusion barrier layer 6b are bundled and arranged in the center. A plurality of the precursors 5c are bundled and disposed around the stabilizing copper portions 4b, and the resulting workpiece is inserted into a Cu pipe, followed by wire drawing. Thereby, a precursor 15 (multi-element wire) shown in FIG. 12 can be obtained. The individual Cu pipes described above constitute a Cu matrix 4.

Figure 12:
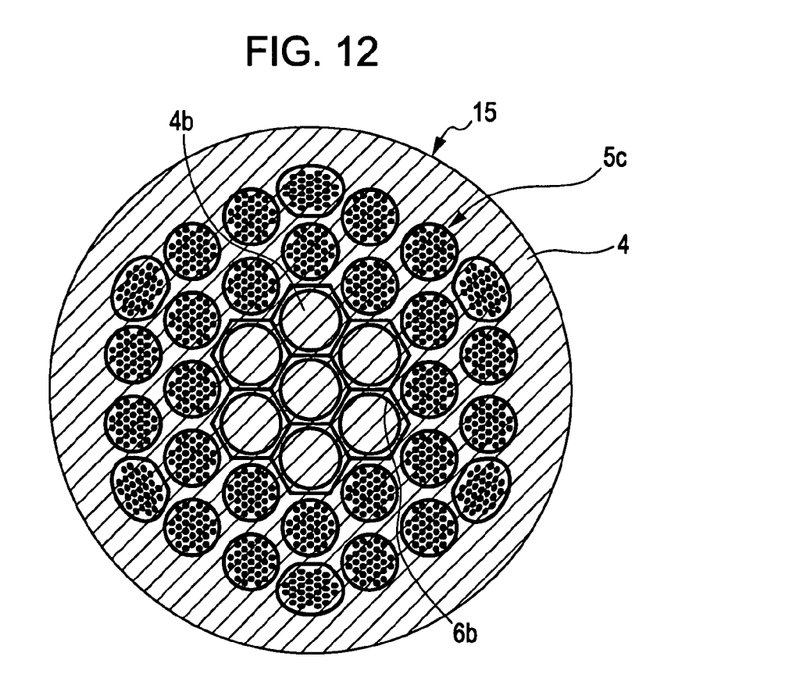
FIG. 12 is a cross-sectional view schematically showing an example of a structure of a precursor for fabricating a superconducting wire (multi-element wire) according to the present invention, which is produced by disposing a plurality of stabilizing copper wires each provided with a diffusion barrier layer and combining the precursor for fabricating a superconducting wire shown in FIG. 11 therewith.

In each of the precursors 12, 13, and 15 shown in FIGS. 8, 9, and 12, the thin diffusion barrier layer 6c (refer to FIG. 7) provided for each single element prevents Sn from being diffused to the outer Cu layer during the diffusion heat treatment, and thus a high-quality Nb₃Sn superconducting phase is generated. At that time, the diffusion barrier layer provided for each single element wire completely reacts with the internal Sn-based metal core 3 to form Nb₃Sn, and Nb as the diffusion barrier layer does not remain. Therefore, superconducting wires can be connected to each other without the occurrence of resistance.

When such a structure is employed, it is necessary to set the thickness of the diffusion barrier layer provided for each single element wire to be equal to or smaller than the diameter of the Nb-based metal core 2. If the thickness exceeds the diameter of the Nb-based metal core 2, unreacted Nb remains, and resistance occurs at the joint. More preferably, the thickness of the diffusion barrier layer is set to be equal to or smaller than the radius of the Nb-based metal core 2.

In the precursor 14 shown in FIG. 10, Sn is completely retained within the diffusion barrier layer by the diffusion barrier layer for each single element, and thus a high-quality Nb₃Sn layer is generated. Such a structure also has an advantage in that even a slight amount of Sn is prevented from being leaked out and wasted when the diffusion barrier layer is formed into Nb₃Sn. Because of diffusion of Sn from both inside and outside the diffusion barrier layer, unreacted portions of Nb constituting the diffusion barrier layer are completely formed into Nb₃Sn, and no Nb remains. Thus, superconducting connection is achieved without the occurrence of resistance.

Nb₃Sn superconducting wires obtained by subjecting the precursors having the structures described above to diffusion heat treatment exhibit higher critical current density (Jc) properties than wires fabricated by the bronze process, thus contributing to reduction in size and cost of NMR magnets, reduction in cost of wires, shortening of delivery time, etc.

In the precursor of the present invention, as the Nb-based alloy used for the Nb-based metal core 2, an alloy formed by adding about 10% by mass of an additive element, such as Ti, Ta, Hf, or Zr, to Nb can be used. Furthermore, with respect to stabilizing copper constituting the precursor of the present invention, the cross-section ratio (copper ratio) of the stabilizing copper portion to the non-stabilizing copper portion is preferably 0.1 to 1.0.

In the precursor of the present invention, stabilizing copper is placed in the center. Preferably, the stabilizing copper is placed in a region which includes the center and extends by a distance of at least 0.15 D from the center point (i.e., a circular region with a diameter of at least 0.3 D, wherein D represents the diameter of the wire, the upper limit of the distance from the center point being 0.35 D (i.e., a circular region with a diameter of 0.7 D). If the distance from the center point is less than 0.15 D in the region, the stabilizing property is insufficient. If the distance is greater than 0.35 D, it is difficult to achieve both the stabilizing property and superconducting properties.

In the present invention, by subjecting the precursors described above to diffusion heat treatment including heat treatment for bronze formation (usually at about 200° C. or higher and less than 800° C.), it is possible to obtain Nb₃Sn superconducting wires having good superconducting properties (critical current density Jc). Specifically, after heat treatment for bronze formation (diffusion of Sn to Cu) in a temperature range of 180° C. to 600° C., heat treatment for generating Nb₃Sn is performed in a temperature range of 650° C. to 750° C. for about 100 to 300 hours. Additionally, as the heat treatment for bronze formation, multistage treatment may be performed in which treatment at 180° C. to 200° C. for about 50 hours, treatment at about 340° C. for about 50 hours, and treatment at about 550° C. for 50 to 100 hours are combined.

The present invention will be described more in details by way of examples. However, it is to be understood that the examples described below do not limit the present invention, and changes in design according to the purposes described above and below are included in the technical scope of the present invention.

Example 1

A superconducting wire (multi-element wire), the cross-sectional shape of which is shown in FIGS. 5A and 5B, was fabricated according to the procedure described below. First, a Nb core with an outside diameter of 28 mm was inserted into a Cu pipe with an outside diameter of 33.8 mm and an inside diameter of 29 mm, and then diameter reduction was performed to form a Cu/Nb composite single-core wire having a hexagonal cross section (each side of the hexagon: 2.3 mm). After correcting was performed, the Cu/Nb composite single-core wire was cut into a length of 2 m. The resulting wires (199 wires) were bundled and inserted into a Cu pipe (outside diameter: 41.2 mm, inside diameter: 37.2 mm), followed by wire drawing, to form a Cu/Nb composite multi-core wire having a hexagonal cross section (each side of the hexagon: 4 mm). After correcting was performed, the Cu/Nb composite multi-core wire was cut into a length of 2 m.

A Sn-2% by mass Ti core was inserted into a Cu pipe (outside diameter: 24 mm, inside diameter: 21 mm), followed by wire drawing, to form a Cu/Sn-2% by mass Ti composite single-core wire having a hexagonal cross section (each side of the hexagon: 4 mm). After correcting was performed, the Cu/Sn-2% by mass Ti composite single-core wire was cut into a length of 2 m. A Cu core (outside diameter: 34.8 mm) around which a Nb sheet (thickness: 0.2 mm) was wrapped was inserted into a Cu pipe (outside diameter: 41.2 mm, inside diameter: 37.2 mm), followed by wire drawing, to form a stabilizing copper wire having a hexagonal cross section (each side of the hexagon: 4 mm) provided with the barrier layer. After correcting was performed, the stabilizing copper wire was cut into a length of 2 m.

Seven stabilizing copper wires each provided with the barrier layer were bundled, and Cu/Nb composite multi-core wires (24 wires) and Cu/Sn-2% by mass Ti composite single-core wires (6 wires) were bundled therearound. The resulting workpiece was inserted into a Cu pipe (outside diameter: 33.8 mm, inside diameter: 29 mm), followed by wire drawing. Thereby, a multi-element wire (precursor for fabricating a superconducting wire) with an outside diameter of 1.0 mm was obtained (refer to FIGS. 5A and 5B). At that time, the stabilizing copper wires in the center were placed in a region extending by a distance of at least 0.25 D from the center point (a circular region with a diameter of 0.5 D), wherein D represents the diameter of the wire.

The resulting multi-element wire (outside diameter: 1.0 mm) was subjected to heat treatment (diffusion heat treatment) at 550° C. for 100 hours and at 670° C. for 100 hours to produce a Nb₃Sn superconducting wire. With respect to the resulting Nb₃Sn superconducting wire, the critical current density Jc and the magnetic field decrement were measured under the conditions described below.

[Measurement of Critical Current Density Jc]

A current was applied to a specimen (superconducting wire) in liquid helium (temperature 4.2 K) in the presence of an external magnetic field of 16 T (tesla), and the generated voltage was measured using the four-terminal method. The current value at which an electric field of 0.1 µV/cm was generated (critical current Ic) was determined. The current value was divided by the cross-sectional area of the entire conductor of the wire to obtain the critical current density Jc. Note that the term "cross-sectional area of the entire conductor of the wire" means the cross-sectional area of the entire wire.

[Measurement of Magnetic Field Decrement]

Figure 13:
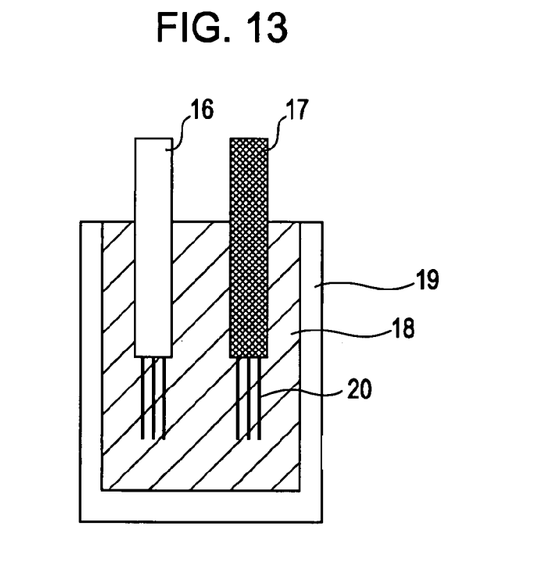
FIG. 13 is a cross-sectional view schematically showing a connection state between a $Nb_3Sn$ superconducting wire of the present invention and a superconducting wire of a superconducting magnet for evaluating connection resistance.
Figure 14:
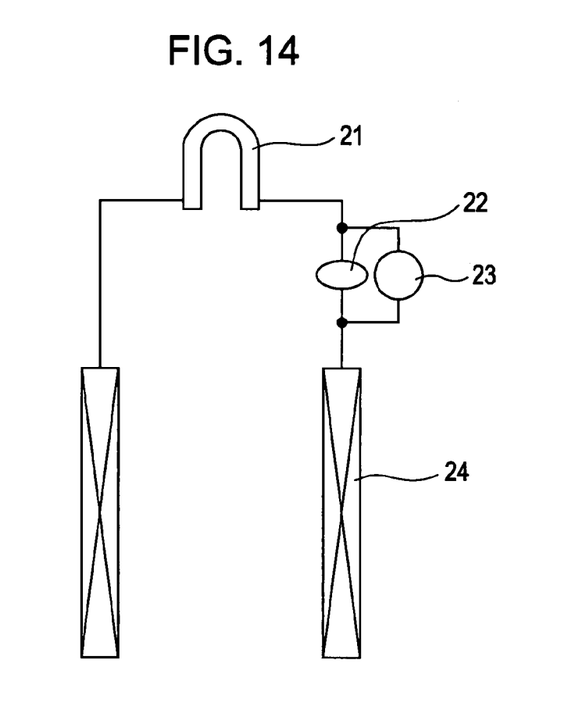
FIG. 14 is a schematic diagram of a circuit for evaluating connection resistance, the circuit being formed by connecting a U-shaped sample for connection made of a $Nb_3Sn$ superconducting wire of the present invention, a permanent current switch, and a superconducting coil.

A circuit for evaluating connection resistance as that shown in FIG. 14 was formed. In FIG. 14, reference numeral 21 represents a U-shaped sample for connection prepared using the Nb₃Sn superconducting wire fabricated, reference numeral 22 represents a permanent current switch, reference numeral 23 represents a power source, and reference numeral 24 represents a superconducting coil. The U-shaped sample 21 for connection was subjected to heat treatment, and then as shown in FIG. 13, the outer Cu sheath was removed at an end 17 of the U-shaped sample 21 for connection to expose Nb₃Sn filaments 20. The end 17 was connected to a superconducting wire 16 of the superconducting coil 24 through a superconducting intermediate (e.g., a Pb-based alloy). The connection was performed at two points (at both ends of the U-shaped sample 21 for connection). A magnetic field of 0.5 T was applied to the joint and the decrement of the magnetic field at the center of the coil 24 was measured. The decrement (ppm/h) was determined with a NMR probe by measuring a change in the resonant frequency (corresponding to the magnetic field). In FIG. 13, reference numeral 19 represents a Cu-based container.

Example 2

A superconducting wire (multi-element wire), the cross-sectional shape of which is shown in FIG. 6, was fabricated according to the procedure described below. First, a Nb core with an outside diameter of 28 mm was inserted into a Cu pipe with an outside diameter of 33.8 mm and an inside diameter of 29 mm, and then diameter reduction was performed to form a Cu/Nb composite single-core wire having a hexagonal cross section (each side of the hexagon: 4.3 mm). After correcting was performed, the Cu/Nb composite single-core wire was cut into a length of 400 mm.

A Cu hollow billet including an external cylinder made of Cu (outside diameter: 143 mm, inside diameter: 125 mm) and an internal cylinder made of Cu (outside diameter: 70 mm, inside diameter: 61 mm) was prepared. The Cu/Nb composite single-core wires (480 wires) were bundled around the Cu internal cylinder of the hollow billet and inserted into the Cu external cylinder. The Cu hollow billet containing the inserted Cu/Nb composite single-core wires was covered with a lid, and after vacuuming, the lid was welded onto the billet.

The resulting billet was subjected to pipe extrusion. Then, a Sn-2% by mass metal core was inserted into the Cu internal cylinder, and wire drawing was further performed to form a single element wire with an outside diameter of 7.7 mm. After correcting was performed, the single element wire was cut into a length of 2 m (refer to FIG. 1). A stabilizing copper wire provided with a barrier layer was assembled as in Example 1 and subjected to wire drawing so as to obtain an outside diameter of 18.3 mm. After correcting was performed, the resulting wire was cut into a length of 2 m. The single element wires (10 wires) were bundled and disposed around the stabilizing copper wire provided with the barrier layer. The resulting workpiece was inserted into a Cu pipe (outside diameter: 43.2 mm, inside diameter: 37.2 mm), followed by wire drawing. Thereby, a multi-element wire (precursor for fabricating a superconducting wire) with an outside diameter of 1.0 mm was obtained (refer to FIG. 6). At that time, the stabilizing copper in the center was placed in a region extending by a distance of up to 0.225 D from the center point (a circular region with a diameter of 0.45 D), wherein D represents the diameter of the wire.

The resulting multi-element wire (outside diameter: 1.0 mm) was subjected to heat treatment (diffusion heat treatment) at 550° C. for 100 hours and at 670° C. for 100 hours to produce a $Nb_3Sn$ superconducting wire. With respect to the resulting $Nb_3Sn$ superconducting wire, the critical current density Jc and the magnetic field decrement were measured as in Example 1. With respect to Examples 3 to 6 and Comparative Examples 1 and 2 which will be described below, the heat treatment and the measurement were performed in the similar manner.

Example 3

A superconducting wire (multi-element wire), the cross-sectional shape of which is shown in FIG. 8, was fabricated according to the procedure described below. First, a Nb core with an outside diameter of 28 mm was inserted into a Cu pipe with an outside diameter of 33.8 mm and an inside diameter of 29 mm, and then diameter reduction was performed to form a Cu/Nb composite single-core wire having a hexagonal cross section (each side of the hexagon: 4.3 mm). After correcting was performed, the Cu/Nb composite single-core wire was cut into a length of 400 mm.

A Cu hollow billet including an external cylinder made of Cu (outside diameter: 143 mm, inside diameter: 128 mm) and an internal cylinder made of Cu (outside diameter: 70 mm, inside diameter: 61 mm) was prepared. A Nb sheet (thickness: 0.2 mm), as a Nb sheet layer, was attached to the interior surface of the Cu external cylinder of the hollow billet. The Cu/Nb composite single-core wires (360 wires) were bundled around the Cu internal cylinder and inserted into the Cu external cylinder. The Cu hollow billet containing the inserted Cu/Nb composite single-core wires was covered with a lid, and after vacuuming, the lid was welded onto the billet. At that time, the thickness of the Nb sheet layer was set to be 0.9 times the diameter of the Nb core (diameter of the Nb core: 3.9 mm, thickness of the Nb sheet layer: 3.5 mm).

The resulting billet was subjected to pipe extrusion. Then, a Sn-2% by mass metal core was inserted into the Cu internal cylinder, and wire drawing was further performed to form a single element wire (precursor for fabricating a superconducting wire) with an outside diameter of 7.7 mm. After correcting was performed, the single element wire was cut into a length of 2 m (refer to FIG. 7). A stabilizing copper wire provided with a barrier layer was assembled as in Example 1 and subjected to wire drawing so as to obtain an outside diameter of 18.3 mm. After correcting was performed, the resulting wire was cut into a length of 2 m. The single element wires (10 wires) were bundled and disposed around the stabilizing copper wire provided with the barrier layer. The resulting workpiece was inserted into a Cu pipe (outside diameter: 43.2 mm, inside diameter: 37.2 mm), followed by wire drawing. Thereby, a multi-element wire (precursor for fabricating a superconducting wire) with an outside diameter of 1.0 mm was obtained (refer to FIG. 8). At that time, the stabilizing copper in the center was placed in a region extending by a distance of at least 0.225 D from the center point (a circular region with a diameter of 0.45 D), wherein D represents the diameter of the wire.

Example 4

A precursor for a superconducting wire (multi-element wire), the cross-sectional shape of which is shown in FIG. 9, was fabricated according to the procedure described below. First, a single element wire was formed as in Example 3, and subjected to wire drawing so as to have a hexagonal cross section (each side of the hexagon: 4.0 mm). After correcting was performed, the single element wire was cut into a length of 2 m. A stabilizing copper wire provided with a barrier layer was formed as in Example 1, and subjected to wire drawing so as to have a hexagonal cross section (each side of the hexagon: 4.0 mm). After correcting was performed, the stabilizing copper wire was cut into a length of 2 m.

The stabilizing copper wires each provided with the barrier layer (7 wires) were bundled, and 30 single element wires were bundled and disposed therearound. The resulting workpiece was inserted into a Cu pipe (outside diameter: 33.8 mm, inside diameter: 29 mm), followed by wire drawing. Thereby, a multi-element wire (precursor for fabricating a superconducting wire) with an outside diameter of 1.0 mm was obtained (refer to FIG. 9). At that time, the stabilizing copper in the center was placed in a region extending by a distance of up to 0.25 D from the center point (a circular region with a diameter of 0.5 D), wherein D represents the diameter of the wire.

Example 5

A precursor for a superconducting wire (multi-element wire), the cross-sectional shape of which is shown in FIG. 10, was fabricated according to the procedure described below. First, a Cu/Nb composite single-core wire having a hexagonal cross section (each side of the hexagon: 4.3 mm) was formed as in Example 2. After correcting was performed, the Cu/Nb composite single-core wire was cut into a length of 400 mm.

A Cu hollow billet including an external cylinder made of Cu (outside diameter: 143 mm, inside diameter: 128 mm) and an internal cylinder made of Cu (outside diameter: 70 mm, inside diameter: 61 mm) was prepared. A Nb sheet (thickness: 0.2 mm), as a Nb sheet layer, was attached to the interior surface of the Cu external cylinder of the hollow billet. The Cu/Nb composite single-core wires (336 wires) were bundled around the Cu internal cylinder and inserted into the Cu external cylinder. The Cu hollow billet containing the inserted Cu/Nb composite single-core wires was covered with a lid, and after vacuuming, the lid was welded onto the billet. At that time, the thickness of the Nb sheet layer was set to be 1.5 times the diameter of the Nb core (diameter of the Nb core: 3.9 mm, thickness of the Nb sheet layer: 5.8 mm).

The resulting billet was subjected to pipe extrusion. Then, a Sn-2% by mass metal core was inserted into the Cu internal cylinder, and wire drawing was further performed to form a single element wire with an outside diameter of 7.7 mm. After correcting was performed, the single element wire was cut into a length of 2 m (refer to FIG. 2). A stabilizing copper wire provided with a barrier layer was assembled as in Example 1 and subjected to wire drawing so as to obtain an outside diameter of 18.3 mm. After correcting was performed, the resulting wire was cut into a length of 2 m. Furthermore, a Cu/Sn-2% by mass Ti composite single-core wire was formed as in Example 1 and subjected to wire drawing so as to obtain a diameter of 3.8 mm. After correcting was performed, the resulting wire was cut into a length of 2 m. The single element wires (10 wires) and the Cu/Sn-2% by mass Ti composite single-core wires (10 wires) were bundled and disposed around the stabilizing copper wire provided with the barrier layer. The resulting workpiece was inserted into a Cu pipe (outside diameter: 43.2 mm, inside diameter: 37.2 mm), followed by wire drawing. Thereby, a multi-element wire (precursor for fabricating a superconducting wire) with an outside diameter of 1.0 mm was obtained (refer to FIG. 10). At that time, the stabilizing copper in the center was placed in a region extending by a distance of up to 0.225 D from the center point (a circular region with a diameter of 0.45 D), wherein D represents the diameter of the wire.

Example 6

A precursor for a superconducting wire (multi-element wire), the cross-sectional shape of which is shown in FIG. 12, was fabricated according to the procedure described below. First, a Cu/Nb composite single-core wire having a hexagonal cross section (each side of the hexagon: 2.3 mm) was formed as in Example 2. After correcting was performed, the Cu/Nb composite single-core wire was cut into a length of 2 m. Furthermore, a Cu/Sn-2% by mass Ti composite single-core wire was formed as in Example 1 and subjected to wire drawing so as to have a hexagonal cross section (each side of the hexagon: 2.3 mm). After correcting was performed, the resulting wire was cut into a length of 2 m.

A Nb sheet (thickness: 0.2 mm) was attached to the interior surface of a Cu pipe (outside diameter: 41.2 mm, inside diameter: 37.2 mm). Then, the Cu/Nb composite single-core wires (154 wires) and the Cu/Sn-2% by mass Ti composite single-core wires (45 wires) were combined and inserted into the Cu pipe, and the resulting workpiece was subjected to wire drawing so as to have a hexagonal cross section (each side of the hexagon: 4.0 mm). After correcting was performed, the resulting wire was cut into a length of 2 m. A stabilizing copper wire provided with a barrier layer was formed as in Example 1, and subjected to wire drawing so as to have a hexagonal cross section (each side of the hexagon: 4.0 mm). After correcting was performed, the stabilizing copper wire was cut into a length of 2 m.

The stabilizing copper wires each provided with the barrier layer (7 wires) were bundled, and 30 single element wires were bundled and disposed therearound. The resulting workpiece was inserted into a Cu pipe (outside diameter: 33.8 mm, inside diameter: 29 mm), followed by wire drawing. Thereby, a multi-element wire (precursor for fabricating a superconducting wire) with an outside diameter of 1.0 mm was obtained (refer to FIG. 12). At that time, the stabilizing copper in the center was placed in a region extending by a distance of up to 0.25 D from the center point (a circular region with a diameter of 0.5 D), wherein D represents the diameter of the wire.

In each of Examples 1 to 6, the copper ratio was set in a range of 0.1 to 1.0.

Comparative Example 1

A precursor for a superconducting wire (multi-element wire), the cross-sectional shape of which is shown in FIG. 3, was fabricated according to the procedure described below. A single element wire formed as in Example 2 was subjected to wire drawing so as to have a hexagonal cross section (each side of the hexagon: 3.9 mm). After correcting was performed, the single element wire was cut into a length of 2 m.

A Nb sheet (thickness: 0.2 mm) was attached to the interior of a Cu pipe (outside diameter: 33.8 mm, inside diameter: 29 mm). The single element wires (37 wires) were combined and inserted into the Cu pipe, followed by wire drawing, to produce a multi-element wire (precursor for fabricating a superconducting wire) with a diameter of 1.0 mm (refer to FIG. 3).

Comparative Example 2

A precursor for a superconducting wire (multi-element wire), the cross-sectional shape of which is shown in FIG. 4, was fabricated according to the procedure described below. A single element wire formed as in Example 5 was subjected to wire drawing so as to have a hexagonal cross section (each side of the hexagon: 4.0 mm). After correcting was performed, the single element wire was cut into a length of 2 m.

The single element wires (37 wires) were bundled and inserted into a Cu pipe (outside diameter: 33.8 mm, inside diameter: 29 mm), followed by wire drawing, to produce a multi-element wire (precursor for a superconducting wire) with a diameter of 1.0 mm (refer to FIG. 4).

With respect to the superconducting wires obtained in Examples 1 to 6 and Comparative Examples 1 and 2, the superconducting properties (critical current density Jc and magnetic field decrement of coil) are shown in Table 1 below.

TABLE 1

|  | Critical current density Jc (A/mm$^2$) | Magnetic field decrement of coil for evaluating connection resistance |
| --- | --- | --- |
| Example 1 | 299 | 0.0070 |
| Example 2 | 305 | 0.0061 |
| Example 3 | 429 | 0.0075 |
| Example 4 | 411 | 0.0069 |
| Example 5 | 450 | 0.0045 |
| Example 6 | 407 | 0.0083 |
| Comparative Example 1 | 483 | 15.008 |
| Comparative Example 2 | 503 | 0.6811 |

As is evident from the results shown above, in the superconducting wires of Examples 1 to 6 which satisfy the requirements specified in the present invention, the magnetic field decrement is very low, and the critical current density Jc is also good. Note that the critical current density Jc must be 280 A/mm$^2$ or more (preferably, 300 A/mm$^2$ or more), and the magnetic field decrement must be 0.01 ppm/hr or less.

What is claimed is:

1. A precursor for fabricating a Nb$_3$Sn superconducting wire, the precursor being used for fabricating the Nb$_3$Sn superconducting wire by an internal Sn process, the precursor comprising:
one or a plurality of stabilizing copper portions collectively disposed in the center, each stabilizing copper portion being provided with a diffusion barrier layer in the periphery thereof; and
a superconducting matrix portion disposed so as to surround the one or the plurality of stabilizing copper portions, the superconducting matrix portion including a Nb or Nb-based alloy core and a Sn or Sn-based alloy core embedded in a Cu or Cu-based alloy matrix,
wherein the superconducting matrix portion includes an aggregate of precursor elements each including a plurality of Nb or Nb-based alloy cores and at least one Sn or Sn-based alloy core, the aggregate being embedded in a Cu or Cu-based alloy matrix, and wherein, apart from the diffusion barrier layer, a diffusion barrier layer made of Nb or an Nb-based alloy is provided for each precursor element.

2. The precursor for fabricating a $Nb_3Sn$ superconducting wire according to claim 1, wherein the diffusion barrier layer provided for each precursor element has a thickness that is equal to or smaller than the diameter of the Nb or Nb-based alloy core.

3. The precursor for fabricating a $Nb_3Sn$ superconducting wire according to claim 1, wherein a Sn or Sn-based alloy core is disposed in the periphery of the diffusion barrier layer provided for each precursor element.

* * * * *